(12) United States Patent
Krömer

(10) Patent No.: US 9,963,275 B2
(45) Date of Patent: May 8, 2018

(54) HOUSING COMPRISING BOTTOM PART AND TOP PART

(71) Applicant: bopla Gehäuse Systeme GmbH, Bünde (DE)

(72) Inventor: Andreas Krömer, Minden (DE)

(73) Assignee: bopla Gehäuse Systeme GmbH, Bünde (DE)

( * ) Notice: Subject to any disclaimer, the term of this patent is extended or adjusted under 35 U.S.C. 154(b) by 240 days.

(21) Appl. No.: 14/821,754

(22) Filed: Aug. 9, 2015

(65) Prior Publication Data

US 2016/0046417 A1    Feb. 18, 2016

(30) Foreign Application Priority Data

Aug. 12, 2014   (EP) .................................. 14 002 809

(51) Int. Cl.
*B65D 45/16*   (2006.01)
*B65D 43/22*   (2006.01)
(Continued)

(52) U.S. Cl.
CPC ............. *B65D 43/22* (2013.01); *B65D 7/12* (2013.01); *B65D 43/16* (2013.01); *B65D 45/16* (2013.01); *E05D 1/06* (2013.01); *H05K 5/0013* (2013.01); *H05K 5/0226* (2013.01); *E05D 1/04* (2013.01); *E05Y 2900/602* (2013.01)

(58) Field of Classification Search
CPC . B65D 43/22; B65D 7/12; B65D 7/26; B65D 45/16; B65D 45/00; B65D 45/02; E05D 1/06; E05D 1/00; E05D 1/04; E05D 3/00; E05D 3/02; E05D 3/06; E05D 7/10; E05D 5/0215; E05D 5/0223; E05D 5/023; E05D 5/0238; H05K 5/0226;
(Continued)

(56) References Cited

U.S. PATENT DOCUMENTS 4,179,844 A * 12/1979 Steuer .................... B60J 7/1642
                                                              16/259
5,065,878 A * 11/1991 Altmann .................. H02B 1/28
                                                              220/3.8
(Continued)

FOREIGN PATENT DOCUMENTS

DE              44 05 947 C1      3/1995
DE      10 2011 116 696 B3       12/2012
(Continued)

*Primary Examiner* — Steven A. Reynolds
*Assistant Examiner* — Javier A Pagan
(74) *Attorney, Agent, or Firm* — Gudrun E. Huckett

(57) ABSTRACT

A housing has a bottom part with a bottom and bottom part sidewalls. A top is provided that has a top and top part sidewalls. The top part is provided on one of the top part sidewalls with one or more integrally formed monolithic first tabs that project outwardly from the top part sidewall. The one or more first tabs each have one or more first screw holes. A first profiled section connector is provided with a first profiled part that has one or more first screw-in options aligned with the one or more first screw holes, respectively. The first profiled part is screw-connected through the one or more first screw holes and the one or more first screw-in options to the top part. The first profiled section connector connects the bottom part and the top part to each other.

15 Claims, 4 Drawing Sheets

(51) Int. Cl.
*E05D 1/06* (2006.01)
*H05K 5/00* (2006.01)
*H05K 5/02* (2006.01)
*B65D 6/00* (2006.01)
*B65D 43/16* (2006.01)
*E05D 1/04* (2006.01)

(58) Field of Classification Search
CPC ...... H05K 5/0221; H05K 5/0217; H02B 1/26; H02B 1/30; H02B 1/38
USPC .......... 220/325, 224, 315; 16/355, 267, 268, 16/269, 270, 382, 383, 384, 380
See application file for complete search history.

(56) References Cited

U.S. PATENT DOCUMENTS

| | | | | |
|---|---|---|---|---|
| 6,727,429 | B1* | 4/2004 | Koessler | H02G 3/088 174/50 |
| 7,378,591 | B2* | 5/2008 | Dinh | H02G 3/086 174/50 |
| 7,414,190 | B2* | 8/2008 | Vo | H05K 5/063 174/50 |
| 8,471,145 | B2* | 6/2013 | Suzuki | H02S 40/34 174/50 |
| 2004/0094318 | A1 | 5/2004 | Koessler | |

FOREIGN PATENT DOCUMENTS

| | | |
|---|---|---|
| EP | 0401085 A1 | 12/1990 |
| FR | 1 408 204 A | 8/1965 |
| WO | 2006/015805 A1 | 2/2006 |

\* cited by examiner

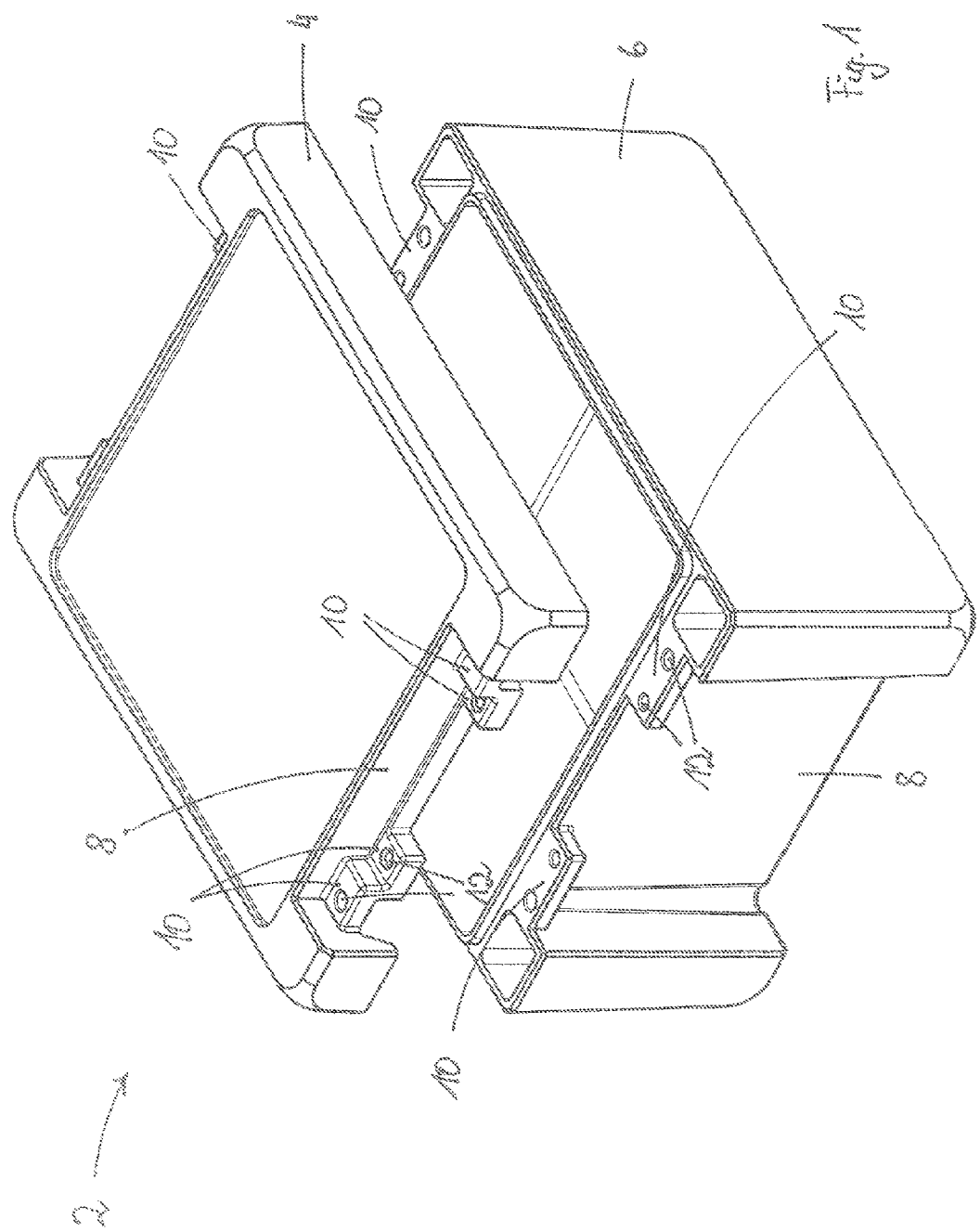

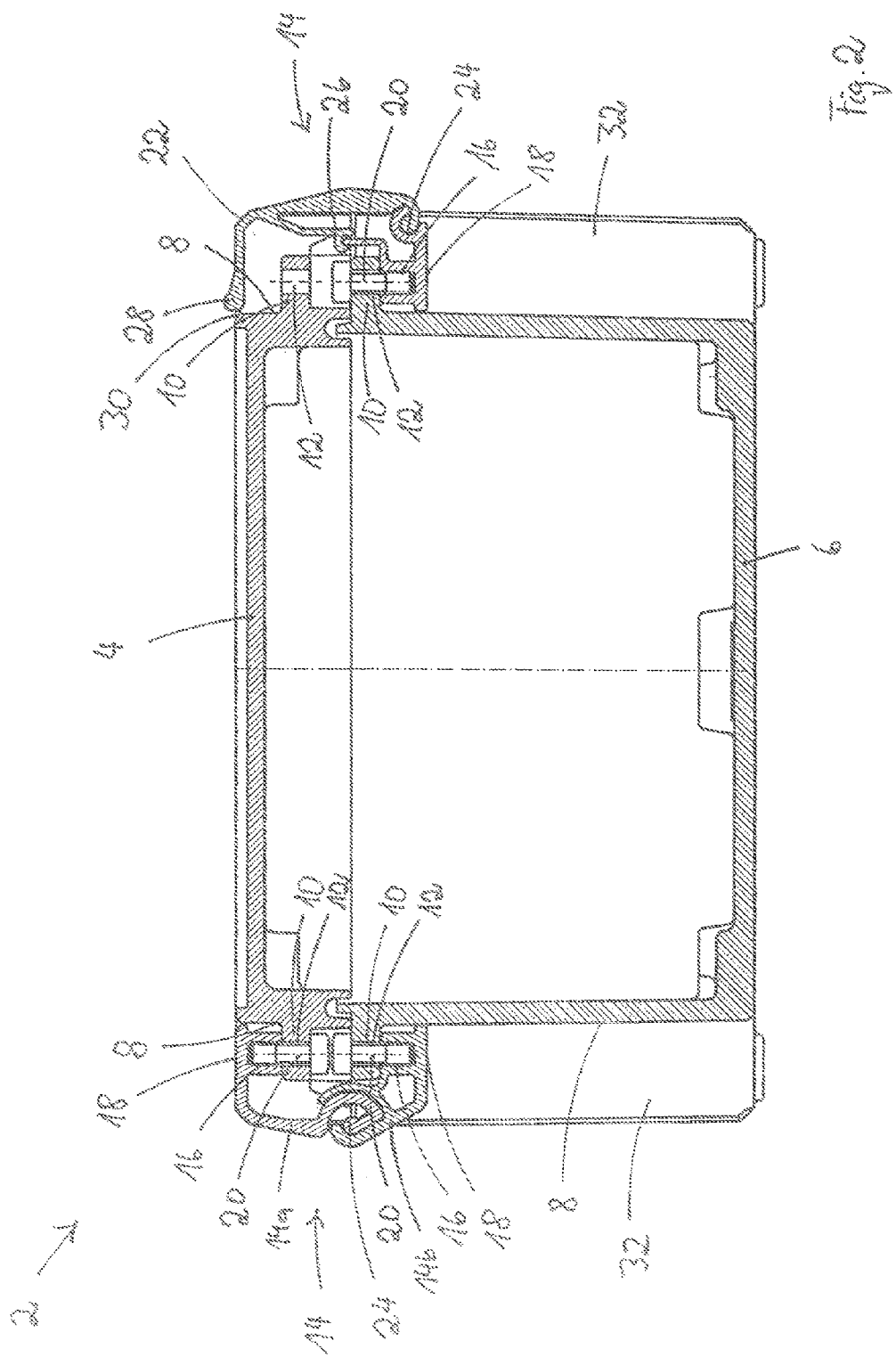

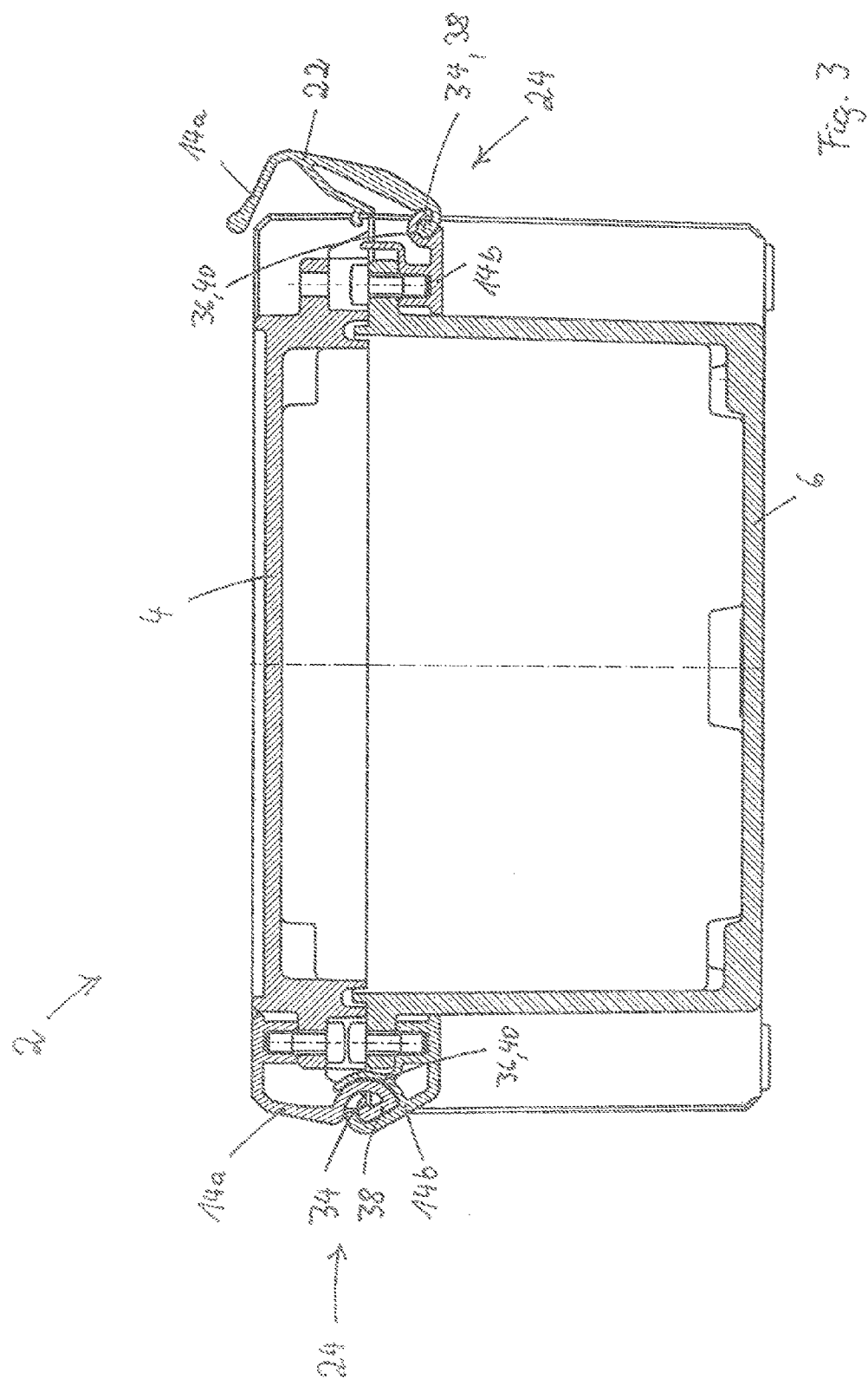

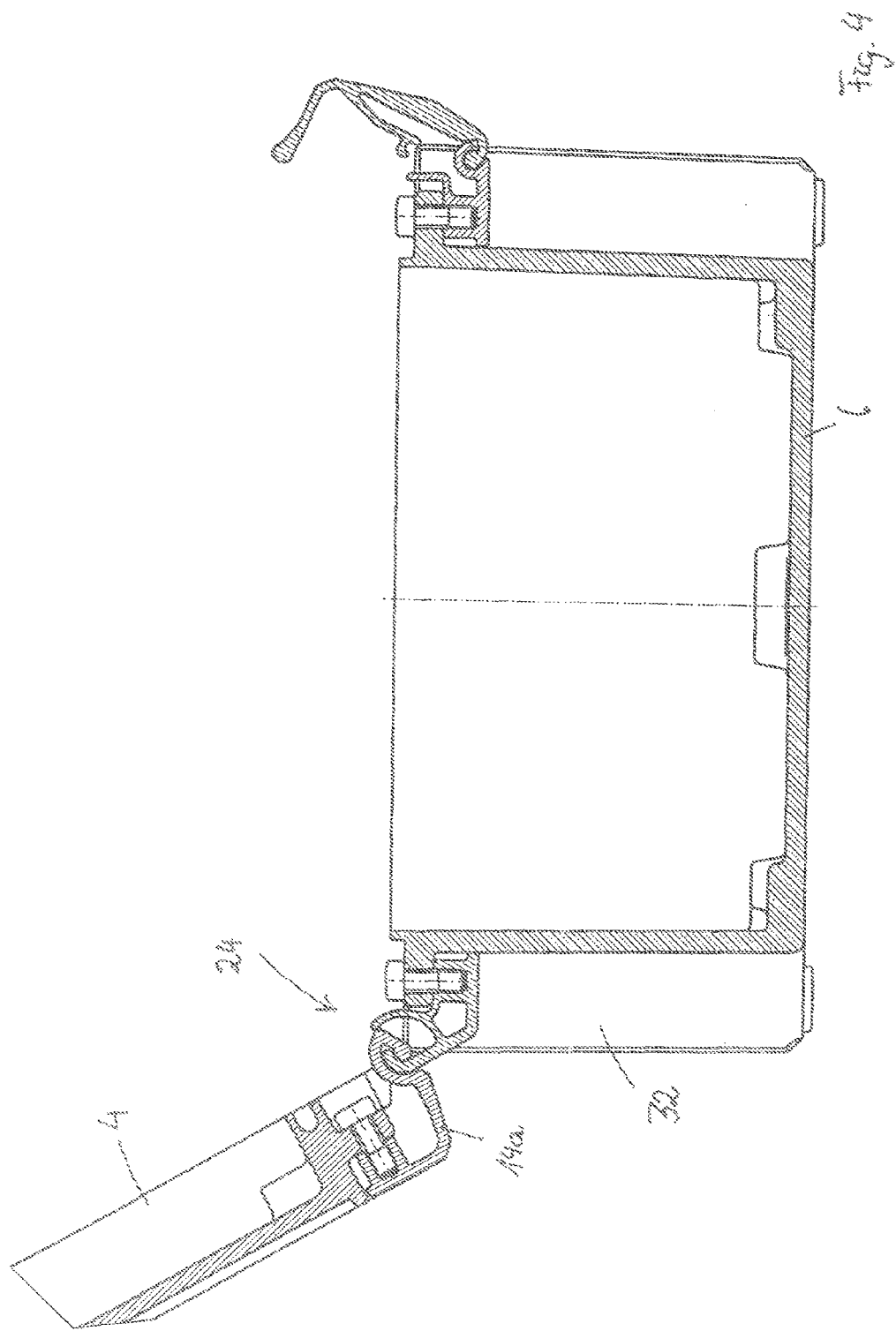

HOUSING COMPRISING BOTTOM PART AND TOP PART

BACKGROUND OF THE INVENTION

The present invention concerns a housing comprising a bottom part and a top part that are connected to each other by a screw connection.

The prior art discloses various possibilities for connecting a top part and a bottom part of a housing to each other. The publication U.S. Pat. No. 5,065,878 discloses strap hinges with terminal base parts that are invisible from the exterior but require a plurality of comparatively large channels within the housing in which they are guided and blocked by terminal stops. Assembly and terminal blocking of such base parts is complex. The publication WO 2006/015805 discloses a housing onto which covers can be placed onto the ends and screw-connected to the housing. The screw connection of the covers is clearly visible.

Accordingly, it is the object of the present invention to provide a connecting possibility for connecting the top part with the bottom part that requires little mounting space, is visually pleasing, and requires minimal assembly expenditure.

SUMMARY OF THE INVENTION

The object is solved for a housing of the aforementioned kind in that on the top part, on at least one side, one or several tabs are integrally formed that project past a neighboring sidewall outwardly and that each have at least one screw hole, and in that the top part by means of the screw hole is screw-connected to a profiled section connector that, at a position corresponding to the screw hole provided on the tab, is also provided with a screw-in option serving for providing a screw connection, and in that the profiled section connector connects the bottom part to the top part.

Connecting the top part with a profiled section connector by means of outwardly projecting tabs provides a good fastening possibility for the profiled section connector. By embodying the screw holes and the screw-in option at matching locations in the tab or tabs and the profiled section connector, the components can be connected to each other in a simple detachable way. The screw-in option that serves for providing the screw connection may also be a screw hole; plugs or other devices for screw connecting may be provided. The exterior shape of the profiled section connector can be designed to be pleasing because the fastening function can be formed on the inner side of the profiled section connector and is not visible in the fastened position. The screw hole in the tab or tabs has a precisely vertical or at least approximately vertical orientation so that a screw-connecting possibility is provided along the sidewall of the housing, from above or from below.

According to one embodiment of the invention, the profiled section connector in its mounted position engages around the tab or tabs formed on the top part from the exterior and from above and has in its outwardly facing area of the screw-in option serving for providing the screw connection a closed surface so that the screw that is screwed into the screw hole at the profiled section connector is screwed in from below into the screw hole. In this configuration, the screw holes or the screw-in option are not visible from the exterior or from above because the upwardly and laterally facing surface of the corresponding area of the profiled section connector is of a closed configuration and the screw is visible only in a viewing direction from the bottom to the top.

According to one embodiment of the invention, the profiled section connector is comprised of two profiled parts that are connected to each other by a hinge. The hinge provides the possibility of pivoting the cover into an opened position and into a closed position without having to completely detach the cover. The hinge function can also be used, or alternatively used, to configure the profiled section connector as a pivotable clamping tab so that the profiled section connector can be clamped to the bottom part and must not necessarily be screwed on.

According to one embodiment of the invention, on the top part and/or on the bottom part in the area of the profiled section connector lateral projections are formed which laterally cover the hinge in the mounted position. Due to the lateral cover of the hinge, dirt cannot so easily penetrate into the hinge area. The visual appearance of the housing is more pleasing when the hinge is not visible. Due to the projections, the sensitive hinge is protected better in regard to lateral impacts and damages. Moreover, the two legs of the profiled section connector that form the hinge can be blocked against sliding relative to each other by the lateral projections so that both legs of the profiled section connector are also secured by the projections in their mounted position. In this way, the housing as a whole is stabilized.

According to one embodiment of the invention, on at least one side of the bottom part, one or several tabs are integrally formed that project outwardly past the neighboring sidewall and each have at least one screw hole. The bottom part is screw-connected by means of the screw hole with a profiled section connector that, at a position that corresponds to the screw hole on the tab, also comprises a screw-in option serving for providing a screw connection. For the tab or tabs that are formed on the bottom part, the same explanations as provided above in regard to the tabs provided on the top part apply likewise. Here also the screw hole in the tab or tabs has a precisely vertical or at least approximately vertical orientation so that a screw-connecting possibility along the sidewall of the housing, from above or from below, is provided.

According to one embodiment of the invention, the profiled section connector engages in its mounted position around the tab or tabs formed on the bottom part from the exterior and from below and has a closed surface in the outwardly facing area of the screw-in option serving for providing a screw connection so that the screw that is screwed into the screw hole associated with the profiled section connector is screwed in from the top into the screw hole. Here also the same explanations as provided above for the profiled section connector connected to the top part apply likewise.

According to an embodiment of the invention, the profiled section connector on one side of the housing is embodied with a hinge or a pivot joint for pivoting the top part relative to the bottom part and a second profiled section connector on the opposite side of the housing is formed as a latching profile that comprises a locking part pivotable about a hinge or a pivot joint. Due to this combination of the profiled section connectors, the top part can be fixedly, but detachably, connected with the bottom part and the housing can be opened in that the latching profile is opened. In this connection, all movable parts are captively secured because the profiled section connectors are fixedly screwed to the top part and the bottom part. The locking part can be designed as a locking bar and/or as a clamping part that is simply clamped onto another component in order to be secured in its locking position.

According to one embodiment of the invention, the locking part has on its inner side that is facing the housing a locking nose with which the profiled section connector is locked in its locking position. Due to the locking nose, the locking part is secured by being latched in its locking position so that it cannot be released from its locking position without a special opening force. Preferably, the locking nose is formed on the inner side of the profiled section connector that is not visible so that the outer visual appearance of the housing is not disturbed by the locking nose.

According to one embodiment of the invention, the locking part has at its end a gripping means such as a grip tab or another configuration for opening. By means of the gripping means, e.g. grip tab, opening and closing of the locking part is facilitated. Instead of the grip tab, other configurations may also be used such as grip depressions, knobs and the like.

According to one embodiment of the invention, on the side of the top part and/or the bottom part that is positioned opposite the tab or tabs, an abutment for connection to the profiled section connector is formed. Due to an abutment, the profiled section connector can be supported in particular in its locking position and positioned in a nominal position. The abutment can have a shape that is formed with form fit relative to the contact surface of the section of the profiled section connector that is contacting it. The abutment can be used for a fixed locking action and/or clamping action of the profiled section connector with the top part or the bottom part.

According to one embodiment of the invention, the top part, the bottom part, and the profiled section connectors are made of metal. As a metal, for example, aluminum or an aluminum alloy can be used. In comparison to plastic housings, metallic housings have a greater strength and shape stability wherein, by configuring also the profiled section connectors as metallic components, the advantages of this material also are maintained in the connecting technology. The temperature resistance, aging resistance of the material, paintability, UV resistance, and other advantages thus also apply to the connecting technology.

According to one embodiment of the invention, the screw-in option serving for providing the screw connection is designed as a groove extending in the longitudinal direction of the profiled section connector whose channel width has undersize relative to the diameter of the inserted screw in its thread area. The groove can also be designed as a threaded channel that, for example, when producing the profile section, is pressed directly into the profiled section. In the configuration of the screw-in option as a groove instead of a screw hole, the profiled section connector, when being mounted, must not be aligned with millimeter precision and precisely centered above the screw hole of a tab; at least in longitudinal direction of the groove this configuration provides more degrees of freedom in regard to mounting. The transverse orientation of the profiled section connector to the top part and/or to the bottom part can be aligned better in regard to a more uniform joint pattern. Primarily, however, when configuring the screw-in option as a continuous groove, it is possible to employ as a profiled section connector continuous bar material that can be produced in an inexpensive way. In case of continuous bar material, a profiled section connector can be cut to a desired length from the bar upon assembly. This provides logistic and cost-related advantages. For producing differently sized housings, it is not required to produce a respective tool of an appropriate length for the profiled section connectors. Due to the undersize of the channel width of the groove, a self-tapping screw that is screwed into the groove still finds enough material in the sidewalls of the groove in order to be safely supported in this material.

According to one embodiment of the invention, the two profiled parts used for a profiled section connector are extruded profiled members that are cut to desired length and the two profiled parts are designed in the hinge area such that the first profiled part is provided with a receptacle with an inner surface that is embodied with a section with a circular arc shape into which the hinge part that is formed on the second profiled part is inserted, wherein the hinge part that is formed on the second profiled part has an outer surface that is embodied with a section with a circular arc shape, the outer surface contacting without clearance, or at least substantially without clearance, the inner surface of the receptacle. Due to this configuration of the two profiled parts, a laterally closed profiled section connector results in which a forcibly guided pivot movement of the pivoted top part or bottom part results by means of the circular arc-shaped surfaces, without wobbling of the components relative to each other. This provides an impression of high quality.

According to one embodiment of the invention, on the bottom part and/or the top part, tabs are provided at different height positions. Due to the different height positions of the tabs, it is possible to screw-connect the top part and the bottom part directly with each other without a pivot possibility wherein, in case of such screw connection, the tabs are advantageously directly resting on each other without intermediate space or with only minimal space relative to each other, or the tabs are spaced apart from each other so far that between them sufficient space remains in order to receive therein the screw heads of the employed screws, without them being visible from the exterior when the housing is closed and without colliding with other components.

It is expressly noted that the afore described embodiments of the invention, considered alone but also in combination with each other, can be combined with the subject matter of the independent claim inasmuch as there are no technically unsurmountable obstacles preventing this.

BRIEF DESCRIPTION OF THE DRAWINGS

Further modifications and configurations of the invention can be taken from the following subject matter description and drawings. The invention will now be explained in more detail with the aid of an embodiment illustrated in the drawings.

FIG. 1 shows a view at a slant from above onto a still open housing.

FIG. 2 is a cross-sectional view of the closed housing.

FIG. 3 is a cross-sectional view of the housing shown in FIG. 2 with open locking part.

FIG. 4 shows the housing illustrated in FIGS. 2 and 3 with cover in pivoted opened position.

DESCRIPTION OF PREFERRED EMBODIMENTS

FIG. 1 shows a housing 2 in which the top part 4 is not yet placed completely onto the bottom part 6 so that the interior of the bottom part 6 is partially visible. In the area of the bottom part and top part sidewalls 8 at the end faces, monolithic tabs 10 are integrally formed on opposed housing sides on the top part 4 and the bottom part 6. Screw holes 12 are provided in the tabs 10.

The tabs 10 which are formed on the top part 4 in the embodiment are formed at different height positions. While the inwardly positioned tabs 10 of the top part upon placing the top part 4 onto the bottom part 6 contact the tabs 10 of the bottom part 6 located underneath, the outwardly positioned tabs 10 on the top part 4 are positioned higher on the sidewall 8 so that upon placement of the top part 4 onto the bottom part 6 there is still a free intermediate space relative to the corresponding tab 10 on the bottom part 6. In this intermediate space screw heads of screw connections can be received.

The tabs 10 that are formed on the top part 4 and the bottom part 6 project past the neighboring sidewall 8, respectively. They form in this way a type of support for a profiled section connector 14 which is not illustrated in detail in FIG. 1.

While the screw holes 12 in the inwardly positioned tabs 10 of the top part 4 in the closed position of the top part 4 on the bottom part 6 are concentric relative to the inwardly positioned screw holes 12 in the tabs 10 formed on the bottom part 6, this is not necessarily required for the outwardly positioned screw holes 12 of the tabs 10 because these screw holes 12 do not serve for providing a direct screw connection of the top part 4 with the bottom part 6 but for connecting with the profiled section connector 14.

In FIG. 2, a section through the closed housing 2 is shown in which also the profiled section connector 14 is illustrated in a closed position. In FIG. 2, the top part 4 is resting on the bottom part 6. In FIG. 2, two different profiled section connectors 14 are shown. On the left side, the profiled section connector 14 is embodied with two profiled parts 14a, 14b that are connected to each other by a hinge 24. While the first profiled part 14a is screw-connected to the top part 4, the second profiled part 14b is screw-connected to the bottom part 6. The screw connection of the profiled parts 14a, 14b of the profiled section connector 14 is realized at the profiled section connector by a respective screw-in option 16, which is configured as a screw hole 12, but may also be configured as a continuous groove in the profiled section connector 14, wherein the groove relative to the circumference of the screw shaft in the threaded area has undersize so that the screw 20 is sufficiently secured in the screw-in option 16. As an alternative, also thread channels can be directly pressed into the profiled section connectors 14 when producing the profiled sections. In the section view, it can be seen well that the profiled section connector 14 in the area of the two screw-in options 16 has outwardly a closed surface 18 so that the screw connections of the profiled section connector 14 with the top part 4 and the bottom part 6 are not visible from the exterior when the housing 2 is closed.

On the right side, an embodiment of a profiled section connector 14 is shown in which a profiled part 14a of the profiled section connector 14 is formed as a latching profile 22. The latching profile 22 can be pivoted into an open or closed position as desired because it is not screwed to the top part 4 but is fixedly connected only by the hinge 24 and the second profiled part 14b to the bottom part 6. On the inner side of the latching profile 22, a locking nose 26 is formed with which the latching profile 22 can be locked in a locking position. When the latching profile 22 is to be pivoted open, it can be gripped at a grip tab 28 and can be manually pivoted away. Other configuration possibilities which enable opening of the latching profile 22 are also conceivable in this context. In the locking position, the latching profile 22 is resting with its upper end against an abutment 30. In the locking position of the latching profile 22, no screws are visible here from the exterior.

The screws 20 which are visible in FIG. 2 must be screwed into the screw holes 12 and into the screw-in options 16 when the top part 4 is opened. After screwing in the three screws 20 that are visible in FIG. 2, the top part 4 can be closed and the tabs 10 located on the right side can be covered by the latching profile 22.

In FIG. 2, it can be seen well that the hinges 24 each are covered in lateral direction by a projection 32 relative to the side. Due to the projections 32 the profiled parts 14a, 14b are secured against unwanted lateral sliding.

In FIG. 3, the section view illustrated in FIG. 2 is shown with the difference that the latching profile 22 has been moved from the locking position into an open position. In FIG. 3, it is shown that the two profiled parts 14b in the hinge area form a receptacle 34 into which the hinge part 38 has been pushed that is formed on the second profiled part 14a. The inner surface 36 of the receptacle 34 as well as the outer surface 40 of the hinge part 38 are designed with a section having a circular arc shape and are resting without clearance on each other. The circular arc-shaped configuration of the mating surfaces enables a pivot movement of the top part 4 relative to the bottom part 6, wherein the pivot axis corresponds to the center point of the circular arc that determines the inner surface 36 and the outer surface 40. Since the profiled parts 14b are positionally secured at the bottom part 6 by screwing, only the latching profile 22 is initially pivoted into an open position and, subsequently, the top part 4 can be pivoted into an opened position wherein for the left profiled section connector 14 the profiled part 14a rotates in the hinge 24 about the pivot axis.

In FIG. 4, the top part 4 is shown in its opened position. In the opened position, the profiled part 14a is still secured against laterally sliding out by the projection 32.

In deviation from the embodiment, the top part 4 must not be designed mandatorily so as to be pivotable relative to the bottom part 6. The invention can be realized in regard to its principle also by profiled section connectors 14 which on opposite end faces are fixedly screwed onto the top part 4 and the bottom part 6, wherein then on one side at least one screw connection must be made from the bottom up because the housing must be closed before realizing the last screw connection. In this case, however, only the last screws that are preferably inserted from the bottom up are visible.

In deviation from the embodiment, opposite sides of the housing 2 can be provided also with a latching profile 22 so that it is possible to lift the top part 4 completely from the bottom part 6.

Due to the circular arc-shaped guiding action of the profiled parts 14a, 14b on each other in the area of the hinge 24, a closed appearance results in the side view in which no open hinge parts are visible.

The afore described embodiment serves only for illustrating the invention. A person of skill in the art will have no difficulties to modify the embodiment in a way appearing suitable to him in order to adapt it to a concrete application situation.

The specification incorporates by reference the entire disclosure of European priority document 14 002 809.3 having a filing date of Aug. 12, 2014.

While specific embodiments of the invention have been shown and described in detail to illustrate the inventive principles, it will be understood that the invention may be embodied otherwise without departing from such principles.

What is claimed is:

1. A housing comprising:
   a bottom part comprising a bottom and bottom part sidewalls;
   a top part comprising a top and top part sidewalls;
   the top part comprising, on a first one of the top part sidewalls, one or more integrally formed monolithic first tabs that project outwardly from said first top part sidewall;
   the one or more first tabs each comprising one or more first screw holes;
   a first profiled section connector comprising a first profiled part comprising one or more first screw-in options that are aligned with the one or more first screw holes, respectively, wherein the first profiled part is screw-connected through the one or more first screw holes and the one or more first screw-in options to the top part;
   the first profiled section connector connecting the bottom part and the top part to each other;
   wherein the first profiled part engages, externally and from above, around the one or more first tabs;
   wherein the first profiled part comprises a closed surface in an outwardly facing area of the one or more first screw-in options so that a screw screwed into the one or more first screw holes is screwed in from below into the one or more first screw holes.

2. The housing according to claim 1, wherein the bottom part comprises, on a first one of the bottom part sidewalls neighboring said first top part sidewall, one or more integrally formed monolithic second tabs projecting outwardly from said first bottom part sidewall, the one or more second tabs each comprising one or more second screw holes, and wherein the first profiled section connector comprises a second profiled part comprising one or more second screw-in options that are aligned with the one or more second screw holes, respectively, wherein the second profiled part is screw-connected through the one or more second screw holes and the one or more second screw-in options to the bottom part.

3. The housing according to claim 1, wherein the one or more first screw-in options are a groove extending in a longitudinal direction of the first profiled part, wherein the groove has a channel width that is less than a diameter of a screw to be inserted for screw-connecting the first profiled part and the top part to each other.

4. The housing according to claim 1, wherein the one or more first tabs are positioned at different height positions.

5. A housing comprising:
   a bottom part comprising a bottom and bottom part sidewalls;
   a top part comprising a top and top part sidewalls;
   the top part comprising, on a first one of the top part sidewalls, one or more integrally formed monolithic first tabs that project outwardly from said first top part sidewall;
   the one or more first tabs each comprising one or more first screw holes;
   a first profiled section connector comprising a first profiled part comprising one or more first screw-in options that are aligned with the one or more first screw holes, respectively, wherein the first profiled part is screw-connected through the one or more first screw holes and the one or more first screw-in options to the top part;
   the first profiled section connector connecting the bottom part and the top part to each other;
   wherein the first profiled section connector comprises a second profiled part connected to the first profiled part by a hinge.

6. The housing according to claim 5, wherein the top part and the bottom part comprise, in an area of the first profiled section connector, lateral projections that laterally cover the hinge.

7. The housing according to claim 5, wherein the top part or the bottom part comprises, in an area of the first profiled section connector, lateral projections that laterally cover the hinge.

8. A housing comprising:
   a bottom part comprising a bottom and bottom part sidewalls;
   a top part comprising a top and top part sidewalls;
   the top part comprising, on a first one of the top part sidewalls, one or more integrally formed monolithic first tabs that project outwardly from said first top part sidewall;
   the one or more first tabs each comprising one or more first screw holes;
   a first profiled section connector comprising a first profiled part comprising one or more first screw-in options that are aligned with the one or more first screw holes, respectively, wherein the first profiled part is screw-connected through the one or more first screw holes and the one or more first screw-in options to the top part;
   the first profiled section connector connecting the bottom part and the top part to each other;
   wherein the bottom part comprises, on a first one of the bottom part sidewalls neighboring said first top part sidewall, one or more integrally formed monolithic second tabs projecting outwardly from said first bottom part sidewall, the one or more second tabs each comprising one or more second screw holes, and wherein the first profiled section connector comprises a second profiled part comprising one or more second screw-in options that are aligned with the one or more second screw holes, respectively, wherein the second profiled part is screw-connected through the one or more second screw holes and the one or more second screw-in options to the bottom part;
   wherein the second profiled part engages, externally and from below, around the one or more second tabs, and wherein the second profiled part comprises a closed surface in an outwardly facing area of the one or more second screw-in options so that a screw screwed into the one or more second screw holes is screwed in from above into the one or more second screw holes.

9. A housing comprising:
   a bottom part comprising a bottom and bottom part sidewalls;
   a top part comprising a top and top part sidewalls;
   the top part comprising, on a first one of the top part sidewalls, one or more integrally formed monolithic first tabs that project outwardly from said first top part sidewall;
   the one or more first tabs each comprising one or more first screw holes;
   a first profiled section connector comprising a first profiled part comprising one or more first screw-in options that are aligned with the one or more first screw holes, respectively, wherein the first profiled part is screw-connected through the one or more first screw holes and the one or more first screw-in options to the top part;
   the first profiled section connector connecting the bottom part and the top part to each other;

wherein the first profiled section connector comprises a second profiled part, wherein the first and second profiled parts are connected by a hinge, and wherein the first and second profiled parts are extruded profile members that are cut to length, wherein the first profiled part comprises a receptacle with an inner surface embodied with a section of a circular arc shape and wherein the second profiled part comprises a hinge part inserted into the receptacle, wherein the hinge part comprises an outer surface embodied with a section of a circular arc shape resting substantially without clearance on the inner surface of the receptacle to form the hinge of the first profiled section connector.

10. A housing comprising:
a bottom part comprising a bottom and bottom part sidewalls;
a top part comprising a top and top part sidewalls;
the top part comprising, on a first one of the top part sidewalls, one or more integrally formed monolithic first tabs that project outwardly from said first top part sidewall;
the one or more first tabs each comprising one or more first screw holes;
a first profiled section connector comprising a first profiled part comprising one or more first screw-in options that are aligned with the one or more first screw holes, respectively, wherein the first profiled part is screw-connected through the one or more first screw holes and the one or more first screw-in options to the top part;
the first profiled section connector connecting the bottom part and the top part to each other;
a second profiled section connector arranged on a side of the housing opposite the first profiled section connector, wherein the first profiled section connector comprises a first hinge configured to pivot the top part relative to the bottom part and the second profiled section connector is a latching profile that comprises a locking part pivotable by a second hinge.

11. The housing according to claim 10, wherein the locking part comprises, on an inner side that is facing the housing, a locking nose configured to lock the second profiled section connector in a locking position.

12. The housing according to claim 10, wherein the locking part comprises a free end with a gripping means.

13. The housing according to claim 10, wherein the top part comprises, on the side of the housing opposite the first profiled section connector, an abutment configured to connect with the second profiled section connector.

14. The housing according to claim 10, wherein the top part, the bottom part, and the first and second profiled section connectors are made of a metal.

15. The housing according to claim 10, wherein the second profiled section connector comprises a first profiled part and a second profiled part connected by the second hinge, wherein the first and second profiled parts of the second profiled section connector are extruded profile members that are cut to length, wherein the first profiled part of the second profiled section connector comprises a receptacle with an inner surface embodied with a section of a circular arc shape and wherein the second profiled part of the second profiled section connector comprises a hinge part inserted into the receptacle, wherein the hinge part comprises an outer surface embodied with a section of a circular arc shape resting substantially without clearance on the inner surface of the receptacle to form the second hinge.

* * * * *